United States Patent [19]
Tury et al.

[11] Patent Number: 6,087,834
[45] Date of Patent: *Jul. 11, 2000

[54] DIAGNOSTIC TESTER FOR LIGHTING SYSTEMS AND METHOD OF USING SAME

[75] Inventors: Edward L. Tury, Brighton; Ken Spink, Jerome, both of Mich.

[73] Assignee: The Shane Group, Hillsdale, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/633,079

[22] Filed: Apr. 16, 1996

[51] Int. Cl.⁷ ...................................... G01R 31/00
[52] U.S. Cl. ........................... 324/414; 324/508; 324/511
[58] Field of Search ..................... 324/414, 511, 324/508, 403, 72.5

[56] References Cited

U.S. PATENT DOCUMENTS

| | | | |
|---|---|---|---|
| 3,934,195 | 1/1976 | Shires | 324/72.5 |
| 4,155,036 | 5/1979 | Nicholson | 324/511 |
| 4,496,905 | 1/1985 | Forte et al. | 324/414 |
| 4,695,803 | 9/1987 | Rue | 324/403 |

FOREIGN PATENT DOCUMENTS

| | | | |
|---|---|---|---|
| 2535930 | 5/1984 | France | 324/414 |
| 495042 | 11/1938 | United Kingdom | 324/403 |
| 2090001 | 6/1982 | United Kingdom | 324/403 |

*Primary Examiner*—Josie Ballato
*Assistant Examiner*—Jose M. Solis
*Attorney, Agent, or Firm*—Young & Basile

[57] ABSTRACT

A diagnostic tester for use with a lighting system having at least one lamp, a ballast, a capacitor, and a plurality of wires interconnecting the lamp, ballast, and capacitor. A diagnostic receptacle is electrically coupled to the lamp, ballast, and capacitor. A connector is adapted to engage the diagnostic receptacle and provide an electrical connection therewith. The connector is electrically coupled to circuits for testing the ballast, the capacitor, and the plurality of wires in the lighting system. An indicator is provided for separately indicating whether the ballast, the capacitor, and the plurality of wires are functioning properly. An indicator may also be employed with a pair of terminals on the tester housing for testing the continuity of a lighting system fuse.

20 Claims, 6 Drawing Sheets

DIAGNOSTIC TESTER FOR LIGHTING SYSTEMS AND METHOD OF USING SAME

FIELD OF THE INVENTION

The present invention relates to an apparatus and method for testing the electrical components and wiring contained in a lighting system.

BACKGROUND OF THE INVENTION

Lighting systems used to illuminate athletic fields such as baseball fields, football fields, soccer fields and the like generally require the installation of light fixtures 20–120 feet above the ground. The light fixtures are often installed in arrays mounted at the top of a support pole. If any light fixture in a lighting array malfunctions, it may be difficult to determine the source of the failure without the use of a crane or ladder capable of reaching the light fixtures.

Lighting systems which use high intensity discharge (HID) lamps require the use of ballasts, capacitors, and various wires interconnecting the components of the lighting system. The failure of a lamp, ballast, capacitor, or wire may result in the failure of the lighting system.

Current test methods involve disconnecting each component to test them individually or swapping each component in and out of the lighting system to locate any defective components. This procedure requires electrical power to be applied to the system, and/or the use of special meters and the technical specifications for each component in order to determine the operability of each component. Furthermore, these tests may isolate problems in a particular component, but cannot detect problems in the wiring between the components without the use of a crane or boom truck to reach the light fixtures at the top of the pole.

Therefore, these previous attempts to locate faults in lighting systems are expensive, time-consuming, and must be performed by an electrician due to the requirement of a live power test. Additionally, the testing of HID lighting systems requires a specialized knowledge not held by all electricians. Thus, previous diagnostic testing systems and methods required a qualified electrician possessing the appropriate knowledge and special meters to test HID lighting systems.

SUMMARY OF THE INVENTION

The present diagnostic tester provides an apparatus for testing a lighting system having at least one lamp, a capacitor, a ballast, and various wires interconnecting these lighting system components. The diagnostic tester is capable of isolating the particular component or wiring in the lighting system producing the failure of the lamp, including failure of the lamp itself. The diagnostic tester connects to a diagnostic receptacle on a light pole easily accessible from the ground, rather than by a crane. The tests are performed with the lighting system power turned off and therefore may be performed by maintenance personnel, rather than an electrician. Since the power is off, the risk of injury due to electric shock is eliminated.

The components of the lighting system are not disconnected to perform the test, thereby making the testing easier, faster, and less expensive. Since the testing is performed at ground level, the use of a crane or similar apparatus is not required. Therefore, maintenance costs are reduced by permitting the quick identification of problem components. Additionally, the diagnostic tester permits the pretesting of light fixtures on the ground before installation on the lighting poles.

The diagnostic tester includes a connector adapted to operatively engage the diagnostic receptacle. Means are provided in the diagnostic tester for automatically and simultaneously testing the ballast, the capacitor, and the plurality of wires contained in the lighting system which connect the capacitor and the ballast to a single lamp.

A multivibrator circuit connected to any illuminatible device is used to test the capacitor and the illuminatible device blinks if the-capacitor is functioning properly. A ballast test circuit includes an illuminatible device, such as a light emitting diode, and a driver for indicating whether the primary and the secondary of the ballast is functioning properly. A wiring test circuit includes at least a pair of light emitting diodes, and possibly an optional LED, along with associated drivers for indicating whether the plurality of wires in the lighting system connected between the ballast and the lamp are properly connected.

A continuity plug is capable of being inserted into the diagnostic receptacle when the diagnostic tester is disconnected from the diagnostic receptacle. The continuity plug, when inserted into the diagnostic receptacle, interconnects the lamp wiring, the ballast and the capacitor in a normal operable manner for normal operation of the lighting system.

When testing the lighting system, power is first disconnected from the lighting system. The LED's in the tester are then tested for proper operation. Next, the continuity plug is removed from the diagnostic receptacle and the diagnostic tester is connected to the receptacle. The capacitor is tested and its associated light emitting diode indicates whether the capacitor is functioning properly. Similar tests are performed on the ballast and wiring contained in the lighting system.

One of the LEDs in the tester may also be employed for indicating the continuity of a lighting system fuse. In this optional embodiment, a pair of terminals are mounted on the tester housing and are engageable with opposite ends of a lighting system fuse. The terminals are connected across the indicator such that the application of electrical power to the indicator and the terminals will enable the indicator to indicate the continuity or non-continuity of a fuse connected across the terminals by the on or off state of the indicator.

In another embodiment in which a lighting system employs a higher wattage lamp which requires the use of a separate ignitor, the diagnostic tester of the present invention may also be employed to test the ignitor by employing the same lighting wiring test procedures described herein.

After all tests have been performed, the diagnostic tester is disconnected from the diagnostic receptacle and the continuity plug is reinserted into the diagnostic receptacle. Finally, power is restored to the lighting system.

BRIEF DESCRIPTION OF THE DRAWINGS

The various features, advantages and other uses of the present invention will become more apparent by referring to the following description and drawings in which.

DETAILED DESCRIPTION OF THE PREFERRED EMBODIMENT

Figure 1:
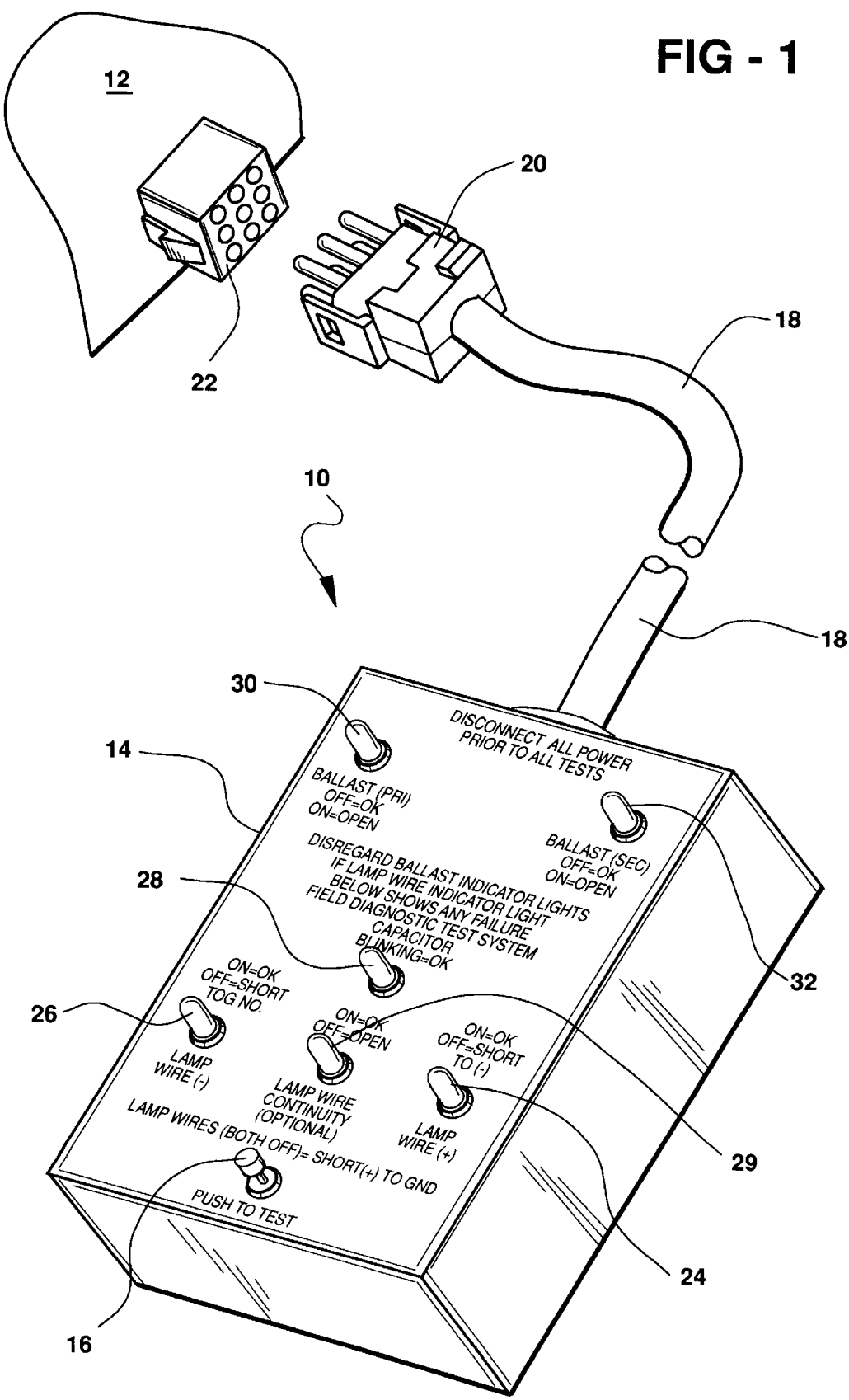
FIG. 1 is a perspective view of a diagnostic tester and diagnostic receptacle according to the present invention.

Referring to FIG. 1, a diagnostic tester 10 according to the present invention is illustrated. Diagnostic tester 10 includes a housing 14 which contains the circuitry and components of the tester 10. A push button switch 16 is used to activate the diagnostic tester 10 as described hereinafter.

A cable 18 extends from diagnostic tester 10 and has a male connector 20 at its terminal end. A ballast box 12, which forms part of the lighting system to be tested and is typically mounted a short distance; i.e., 10 feet, above grade on a light pole, includes a female multi-pin diagnostic receptacle 22. Receptacle 22 is mounted within ballast box 12 and is electrically connected to the various components of the lighting system. Preferably, male connector 20 is a plug-in, quick-release connector which is designed to mate with diagnostic receptacle 22. However, any other type of connector may be employed in the present diagnostic tester 10.

Diagnostic receptacle 22 may be installed in ballast box 12 at the time of manufacture, or may be retrofitted into an existing ballast box already installed in a lighting system. To retrofit receptacle 22 to an existing ballast box, the receptacle 22 is connected as described below with reference to FIG. 2. A complete lighting installation may include several ballast boxes, with each ballast box having a diagnostic receptacle for each ballast therein.

Diagnostic tester 10 is a small hand-held device capable of being carried easily from one test location to another. Tester 10 has an internal power source and performs the tests automatically, thereby requiring only minimal interaction by the operator.

Separate illuminatible devices, such as light emitting diodes, (LED's 24, 26, 28, 30, and 32) are used to indicate whether various components of the lighting system are functioning properly. LED 29 is optional, as described hereafter. The function of each LED will be described below with reference to the schematic diagram illustrated in FIG. 4. Although the present invention is described as utilizing light emitting diodes, it will be understood by those skilled in the art that various other types of indicator and illuminatible devices may be used to indicate proper component operation. Such other devices include various types of lights, meters, or display panels.

Figure 2:
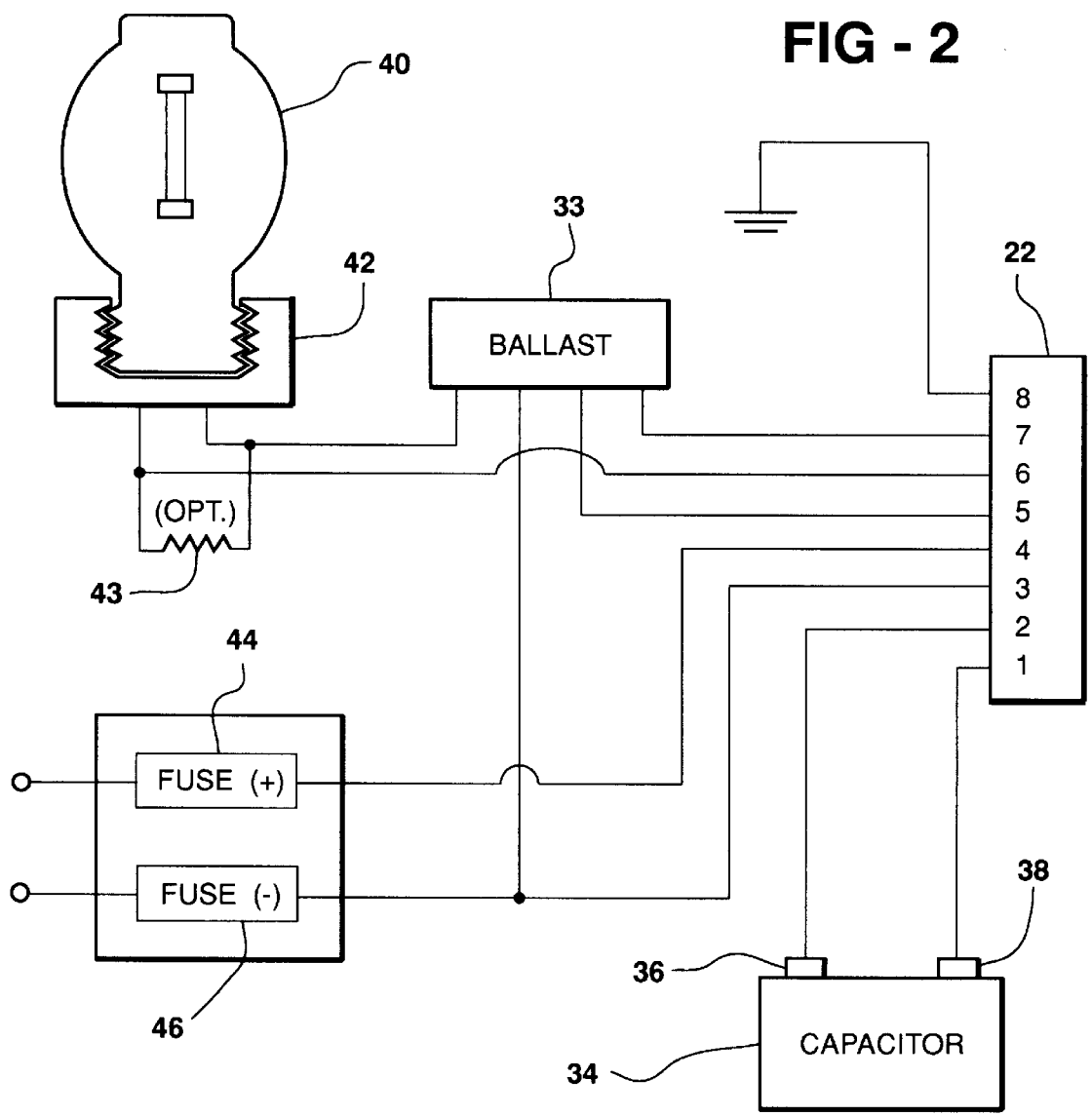
FIG. 2 is a block diagram illustrating the interconnection of the diagnostic receptacle with various components of a lighting system.

FIG. 2 illustrates a block diagram of the various components in the lighting system and their electrical interconnection with each other and with diagnostic receptacle 22. Receptacle 22 is shown having a plurality of electrical connection points representing a plurality of electrical pins in the receptacle 22. A ballast 33 is connected to pin 7 of diagnostic receptacle 22. Additionally, ballast 33 is connected to a lamp 40, and a negative line fuse 46. A capacitor 34 has a first terminal 36 and a second terminal 38. First capacitor terminal 36 is connected to pin 2 of diagnostic receptacle 22, and second capacitor terminal 38 is connected to pin 1 of the diagnostic receptacle. An HID lamp 40 is mounted in lamp socket 42 which is connected to ballast 33 and pin 6 of diagnostic receptacle 22. An optional resistor 43 is connected across the leads of the socket 42. A positive line fuse 44 is connected to pin 4 of diagnostic receptacle 22. Negative line fuse 46 is connected to ballast 33 as well as pin 3 of diagnostic receptacle 22.

Figure 3:
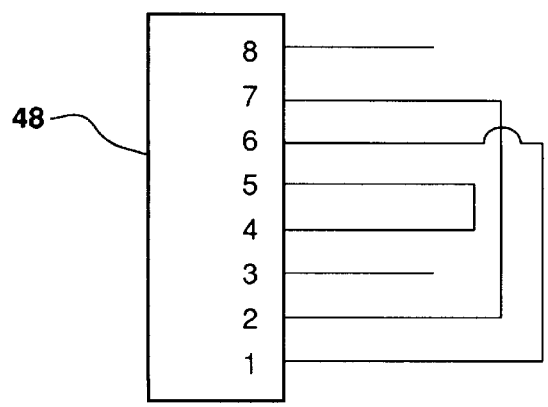
FIG. 3 is a schematic diagram showing a continuity plug as used with the present invention and its electrical connections.

When the diagnostic tester 10 is not attached to diagnostic receptacle 22, a continuity plug 48 is mated with the diagnostic receptacle 22. FIG. 3 illustrates the electrical connections contained within continuity plug 48. The pin numbers illustrated in FIG. 3 correspond with and electrically connect with the pin numbers illustrated in FIG. 2 with respect to diagnostic receptacle 22. In particular, pins 4 and 5 are shorted together, thereby directing power from positive line fuse 44 directly to ballast 33. Additionally, pins 7 and 2 are shorted together, thus connecting the first capacitor terminal 36 to ballast 33. Finally, pins 1 and 6 are shorted together, thereby connecting second capacitor terminal 38 to lamp socket 42. Therefore, when continuity plug 48 is mated with diagnostic receptacle 22, the lighting system operates in a normal manner.

Figure 4:
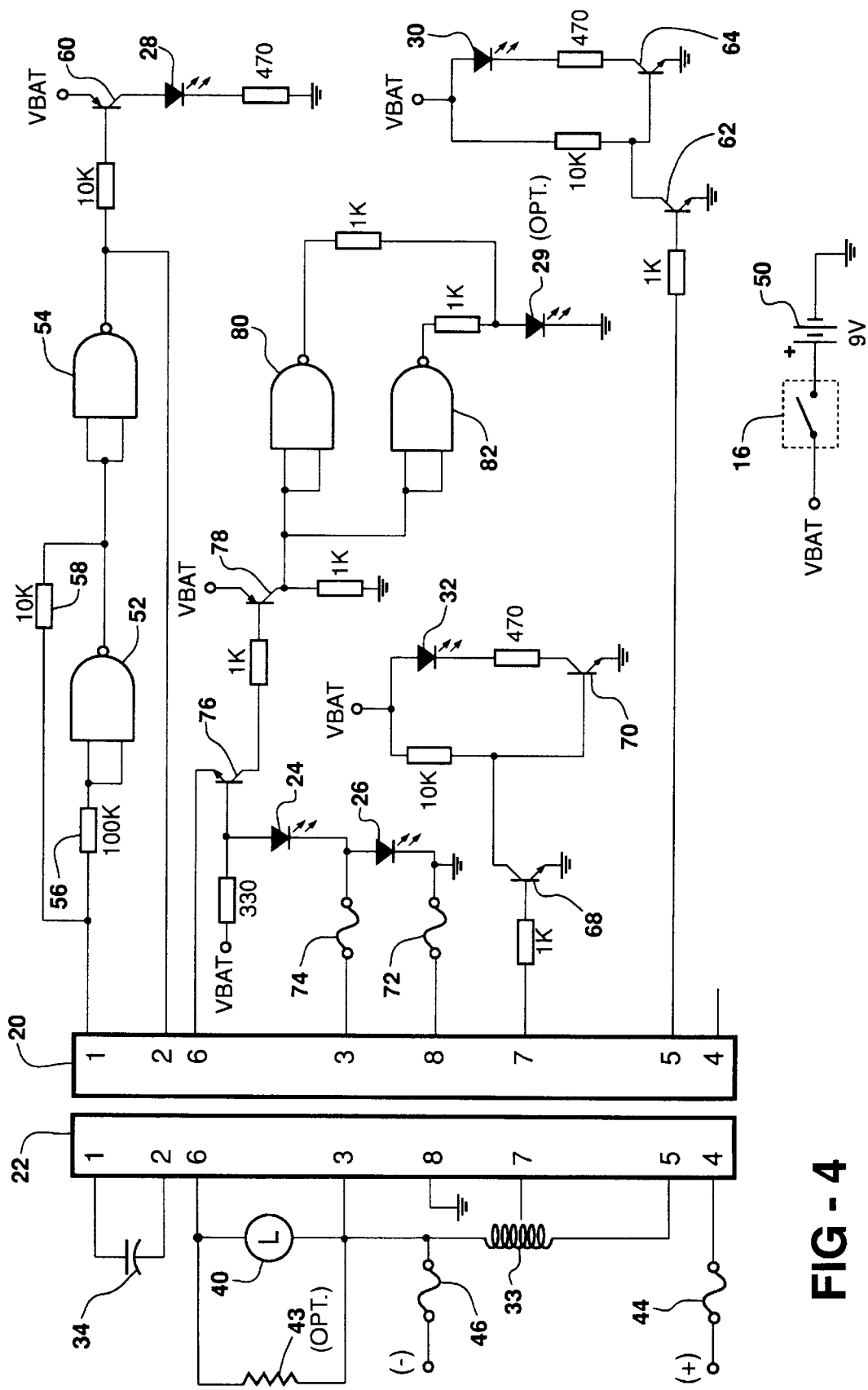
FIG. 4 is a schematic diagram of the inventive diagnostic tester and the lighting system components being tested.

FIG. 4 illustrates a schematic diagram of the diagnostic tester 10 circuit as well as the lighting system components being tested. The left side of the schematic illustrated in FIG. 4 represents the components of the lighting system, and resembles the connections illustrated in FIG. 2. Capacitor 34 is connected between pins 1 and 2 of diagnostic receptacle 22. Pin 4 of diagnostic receptacle 22 is connected to positive line fuse 44, and pin 8 of the diagnostic receptacle is connected to ground. Pins 3, 5, and 7 are connected to ballast 33, while pins 6 and 3 are connected to lamp 40.

Male connector 20 on diagnostic tester 10 is a multi-pin connector which mates with diagnostic receptacle 22. Preferably, connector 20 is a quick-release connector for simple connection with receptacle 22.

A 9-volt battery 50 is connected between ground and switch 16, thereby providing power (indicated by signal VBAT) to the tester circuit when the switch 16 is depressed. The various illuminatible devices or LED's 24, 26, 28, 29, 30 and 32 are biased by their respective drive transistors to a conductive state when VBAT power is applied thereto and the connector 20 is disconnected from the connector 22 on the receptacle 12. This provides a check of the operability of each LED.

Pins 1 and 2 of connector 20 connect with capacitor terminals 36 and 38. The circuit formed by NAND gates 52 and 54 as well as resistors 56, 58 creates a multi-vibrator circuit with capacitor 34. When capacitor 34 is connected and functioning properly, the multi-vibrator circuit oscillates, thereby causing transistor 60 to turn on and off and causing LED 28 to blink. If LED 28 does not blink, then the capacitor 34 is either defective or improperly connected. The rate at which LED 28 blinks is a function of the capacitance of capacitor 34. The greater the capacitance of capacitor 34, the slower LED 28 blinks. If LED 28 blinks extremely fast, capacitor 34 may be defective; i.e., the capacitor 34 may have a reduced capacitance.

The ballast continuity is tested using pins 5 and 7 of connector 20. The circuit connected to pin 5 of connector 20 tests the ballast primary. If the ballast primary is functioning properly, a base current is conducted to transistor 62, functioning as a switch means to connect the remainder of the circuit to ground. Therefore, the base of transistor 64 is connected to ground, thereby extinguishing LED 30. Therefore, if LED 30 is illuminated, the ballast primary is malfunctioning, i.e., an open circuit.

Pin 7 of connector 20 is connected through a resistor to the base of transistor 68, which receives a base current from the ballast secondary. If a base current is present, transistor 68 functions as a switch means to connect the remainder of the circuit to ground, thereby extinguishing LED 32. An illuminated LED 32 indicates a malfunctioning ballast secondary.

The lamp 40 wiring extends from the ballast 33 and the receptacle 22 up along a light pole, not shown, to a junction connection with leads to the socket 42 in the light fixture.

If the lamp wiring is not connected properly, i.e., open at the socket 42, transistor 76 will conduct through optional resistor 43, thereby causing transistor 78 to conduct. The activation of transistor 78 causes signal VBAT to be applied to the inputs of NAND gates 80 and 82. Since the inputs of NAND gates 80 and 82 are wired together as inverters, a logic HI signal is applied to the NAND gate inputs thereby generating a logic LO signal at the output and extinguishing optional LED 29. Therefore, if LED 29 is off, a lamp socket wiring continuity fault is indicated. Conversely, if LED 29 is illuminated, proper lamp socket wiring is present.

In the preferred form, an HC4011 integrated circuit is used to provide the four NAND gates 52, 54, 80, and 82. The two inputs of each NAND gate are electrically connected together, thereby causing each NAND gate to operate as an inverter.

As shown in FIG. 4, the positive power lead is connected through transistor 76 and LED's 24 and 26 to ground. A fuse 74 is connected to pin 3 of the connector 20 and to the junction of LED's 24 and 26. LED 26 is connected through fuse 72 to ground in the receptacle 22. Thus, LED 24 will be illuminated if the positive lamp wiring is properly connected; but when not illuminated, a short to the negative lead is present. Similarly, LED 26 will be illuminated if the negative lamp wiring is properly connected. When LED 26 is not illuminated a short of the negative wiring to ground is indicated. If both LED's 24 and 26 are not illuminated at the same time during a test, a short of the positive wiring to ground is present.

Figure 5:
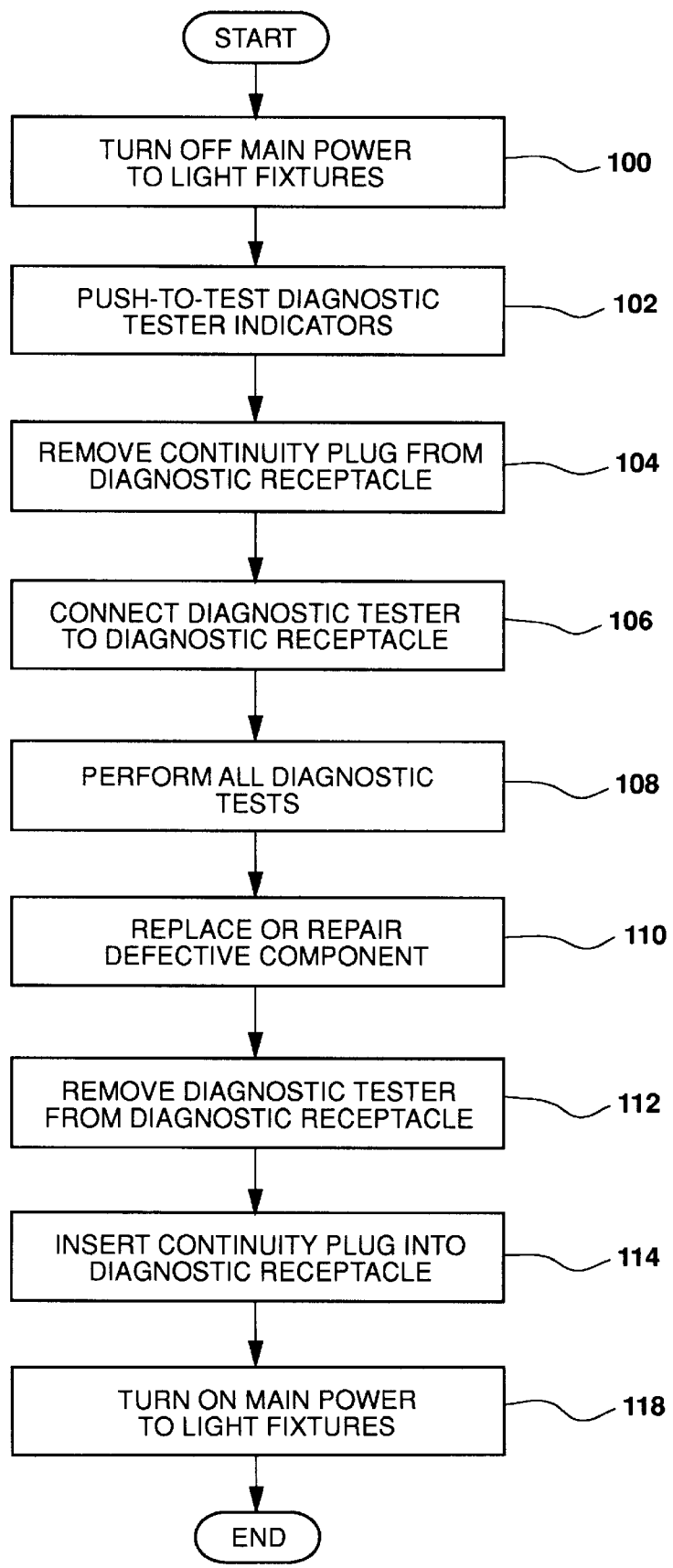
FIG. 5 is a flow chart describing the overall procedure used when testing a lighting system according to the present invention.

In operation, the lighting system is tested with the main power off, as shown in FIG. 5 at step 100. At step 102, before the tester 10 is connected to the receptacle 22, switch 16 is depressed to test the operability of all of the LED's in the tester 10 by applying power to each LED to cause illumination of each operable LED. Next, continuity plug 48 is removed from diagnostic receptacle 22 at step 104. Next, at step 106, the diagnostic tester 10 is connected to diagnostic receptacle 22, causing all diagnostic tests to be performed automatically at step 108.

Depending on the lighting system components which do not pass the diagnostic tests, one or more LED's on the diagnostic tester will indicate a faulty component or faulty wiring by an "on" or "off" state as described above and as shown in FIG. 1 on the face of the tester 10. If the diagnostic tester 10 indicates that all tests have passed, but one or more lamps in the lighting system are not functioning properly, this indicates that the lamp is at fault. Thus, the tester 10 determines a lamp fault by process of elimination; i.e., if all other components and wiring are functioning properly, then the lamp must be the defective component.

At step 110, the defective component or components are replaced or repaired. At step 112, the diagnostic tester 10 is removed from diagnostic receptacle 22, and continuity plug 48 is reinserted into the diagnostic receptacle at step 114. Finally, at step 118, main power to the light fixtures in the lighting system is turned on.

Figure 6:
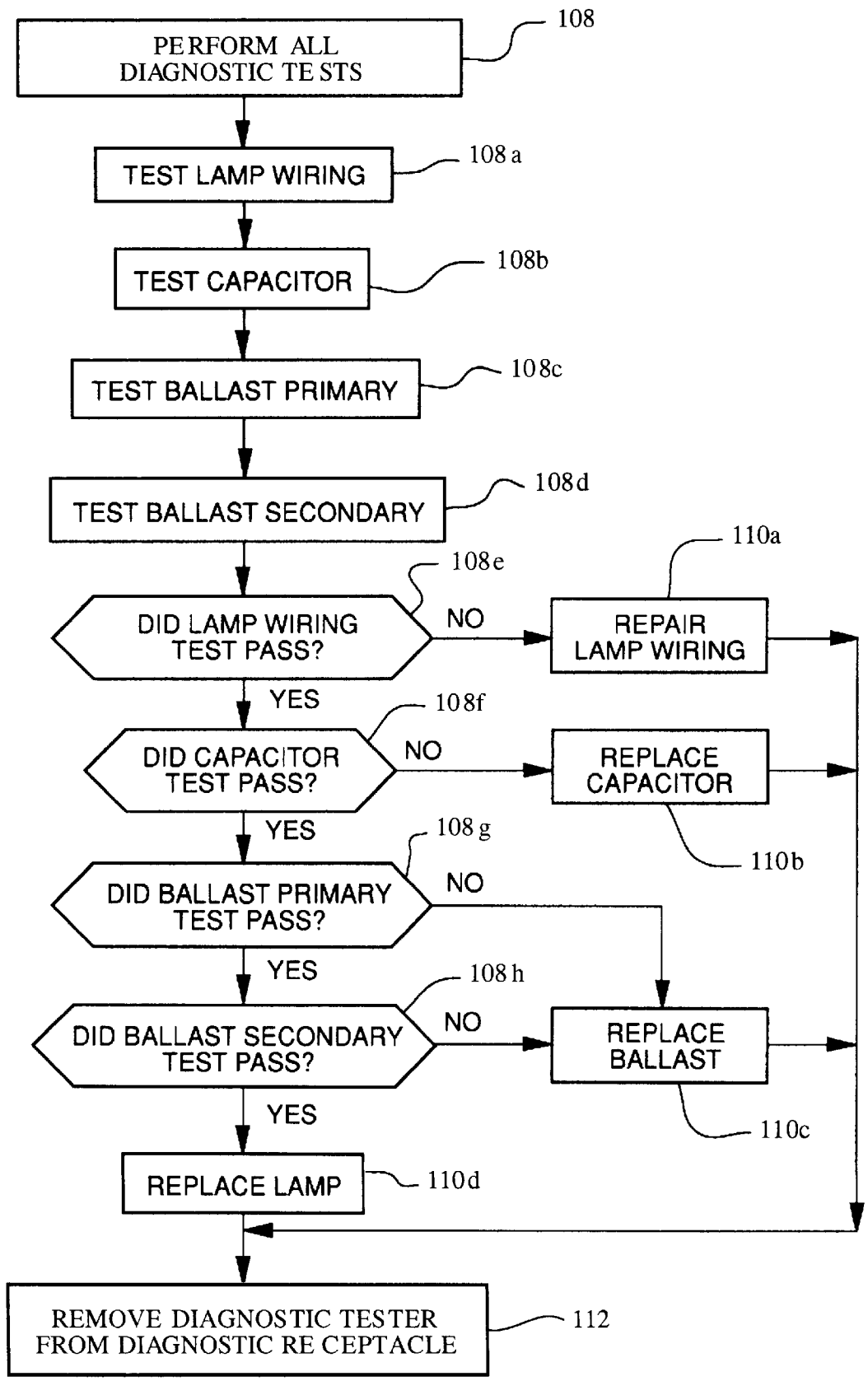
FIG. 6 is a flow chart describing the procedure followed to determine which component or components of the lighting system are malfunctioning.

FIG. 6 is a flow chart which illustrates the procedure followed to determine which component or components of the lighting system are malfunctioning. In FIG. 6, steps 108 and 110 are expanded. After the diagnostic tester 10 is connected to the diagnostic receptacle 22, step 108a tests the lamp wiring, step 108b tests the capacitor, step 108c tests the ballast primary, and step 108d tests the ballast secondary. Although steps 108a–108d are illustrated as four separate steps, these tests are performed simultaneously by the diagnostic tester 10 as illustrated at unified step 108 in FIG. 5. As shown in FIG. 4, separate test circuits are provided to test each component of the system, thereby permitting simultaneous testing of the lighting components. The results of all diagnostic tests are indicated by the LED's on the diagnostic tester 10.

At step 108e the operator determines whether the lamp wiring test passed by observing LED's 24, 26 and/or optional LED 29. If LED 24 is illuminated or "on" the positive wire is properly connected. However, an off or not illuminated state for LED 24 indicates that the lamp positive wire is shorted to the negative wire. LED 26 provides a similar indication of the operability of the negative lamp wire, but with an off state indicating a short to ground. An "off" or non-illuminated state of both LED's 24 and 26 indicates that both that the positive wire is shorted to ground. If LED 29 is illuminated or on, then the lamp socket leads have continuity. If LED 29 is not illuminated, then there is a fault in the lamp leads at the lamp socket. If any part of the lamp wiring test did not pass, then the lamp wiring is repaired at step 110a, and the testing procedure is completed at step 112 in FIG. 5 by removing the diagnostic tester 10 from the diagnostic receptacle 22. If the lamp wiring test passed at step 108e, then the operator next determines whether the capacitor test passed at step 108f.

If the capacitor 34 is functioning properly, LED 28 blinks on and off. If LED 28 does not blink, or blinks extremely fast, then the capacitor 34 is faulty. If the capacitor test did not pass, then the capacitor 34 is replaced at step 110b, and the testing is completed at step 112 in FIG. 5.

If the capacitor test passed at step 108f, then the operator next determines whether the ballast primary test passed at step 108a. LED 30 is off if the ballast primary is functioning properly. If LED 30 is illuminated, then the ballast primary is open. If the ballast primary test failed, the ballast 33 is replaced at step 110c.

If the ballast primary test passed, then the user next determines whether the ballast secondary test passed at step 108h. If LED 32 is off, then the ballast secondary is functioning properly. An illuminated LED 32 indicates that a fault exists in the ballast secondary. If the ballast secondary test failed, then the ballast 33 is replaced at step 110c, and the lighting tests are completed.

If the ballast secondary test passed, and the lighting system is still inoperative, then the lamp 40 is replaced at step 110d, and the testing is completed at step 112 in FIG. 5. Thus, the lamp 40 is tested by process of elimination. As shown in FIG. 6, the wiring, capacitor, ballast primary, and ballast secondary are tested first to determine proper operation. If any one or more of these components fail their respective test, then that particular component is repaired or replaced. If a lighting system is not functioning properly, but all four of the above-mentioned tests passed, the lamp 40 is determined to be at fault and is replaced. Therefore, if the lighting system is not working and all components except the lamp 40 are functioning properly, the lamp 40 must be the malfunctioning component in the lighting system.

Once the diagnostic tester 10 is connected to the diagnostic receptacle, the diagnostic tester 10 performs all tests automatically and simultaneously. The diagnostic tester 10 does not require any user input or user intervention, other than determining the status of the various LED's in the diagnostic tester 10 during testing.

It should also be noted that even though the present diagnostic tester 10 has been described as simultaneously testing each of the ballast 33, the capacitor 34 and the lamp wiring, the diagnostic tester 10 can also be constructed to test any one or two of these components.

Figure 7:
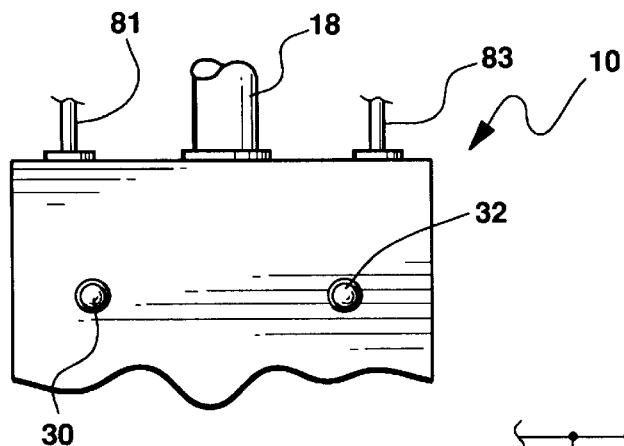
FIG. 7 is a pictorial representation of a modification to the diagnostic tester of the present invention according to an alternate embodiment of the present invention.
Figure 8:
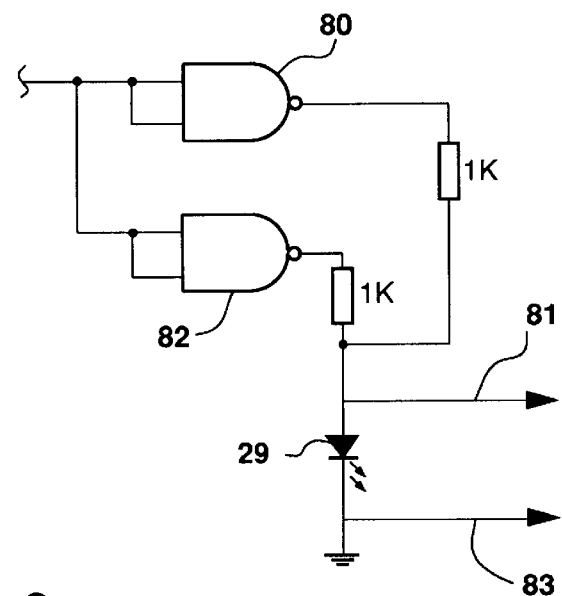
FIG. 8 is a partial schematic representation showing a modification to the schematic of FIG. 4 for use in conjunction with the modification depicted in FIG. 7.

The diagnostic tester 10 of the present invention may also be modified to perform additional tests. As shown in FIGS. 7 and 8, the diagnostic tester 10 may be used to test the continuity of the fuses 44 and 46 used in the lighting system circuit. As is conventional, such fuses 44 and 46 are typically of the "midget" type and have two opposed conductive end caps or contacts. As shown in FIG. 7, a pair of terminals 81 and 83 are mounted on the housing of the diagnostic tester 10 at any convenient location. Thus, although the pair of terminals 81 and 83 are shown as being mounted on the top of the housing, it will be understood that the pair of terminals 81 and 83 may also be mounted on the bottom or any other surface of the housing. The terminals 81 and 83 are connected across the optional indicator or LED 29 as shown in FIG. 8.

In use, the terminals 81 and 83 are engaged with opposite conductive ends of a fuse 44 or 46. The "push-to-test" push button 16 is then depressed to supply power to the transistors 76 and 78, shown in FIG. 4, and to the NAND gates 80 and 82 shown in FIGS. 4 and 8. If the fuse connected across the terminals 81 and 83 has continuity, the LED 29 will be in a non-illuminated state. However, if the fuse is defective or open, the LED 29 will be illuminated thereby providing indication of a defective fuse. It should be noted that the fuse test is conducted while the connector 18 is disconnected from the ballast box 12.

Figure 9:
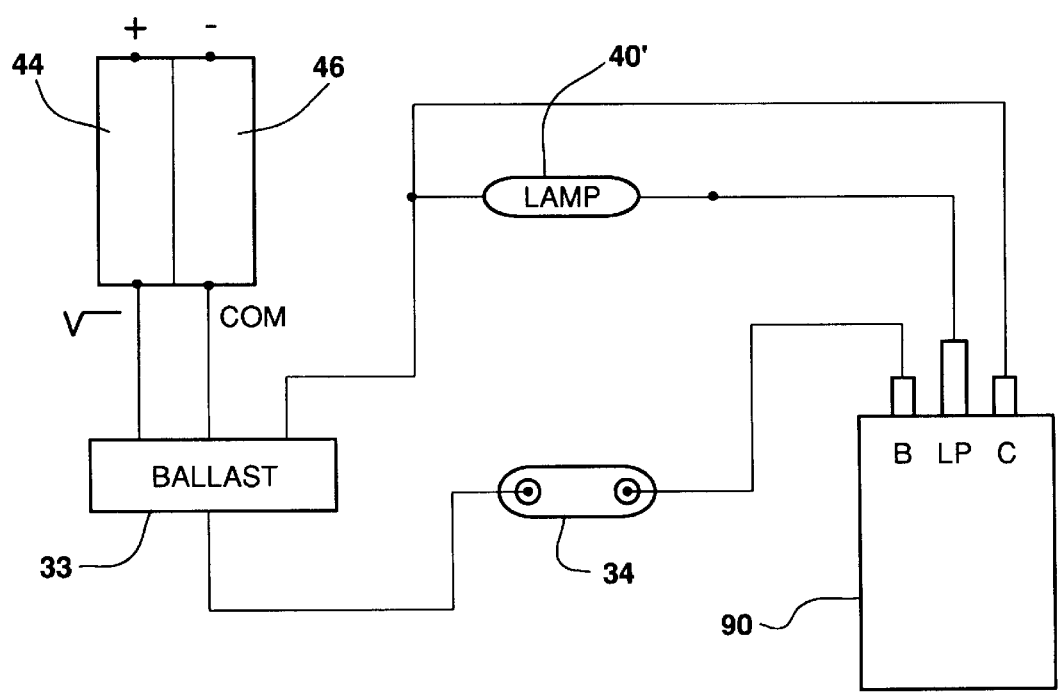
FIG. 9 is a schematic diagram of an alternate light system circuit which can be tested by the diagnostic tester of the present invention.

The diagnostic tester 10 may also be used to detect the operability of an ignitor 90 shown in FIG. 9 which is used with a higher wattage lamp 40', such as a 2000 watt lamp. Such a higher wattage lamp will require a capacitor 34 and a higher wattage ballast 33 which are interconnected with fuses 44 and 46 as shown in FIG. 9. It will also be understood that a second series connected ballast 33 and capacitor 34 may be connected in parallel with the ballast 33 and capacitor 34 shown in FIG. 9.

As the leads of the lamp 40' are connected to the lamp post and common terminals of the ignitor 90, the diagnostic tester 10 can also test the operability of the ignitor 90 in the same manner as the test described above for testing proper wiring of the lamp leads. The lamp socket connections are connected to the connector pins 3 and 6 as shown in FIG. 4 and can provide an indication of the operability or non-operability of the ignitor 90 by performing the same lamp wiring test described above. Thus, if the ignitor has failed, typically by shorting to ground, the lamp connection will be open causing transistors 76 and 78 to conduct as shown in FIG. 4 and described above. Conduction of transistor 78 through the NAND gates 80 and 82 causes the optional LED 29 to remain off when a continuity fault is present or to remain illuminated when proper ignitor 90 operation is detected.

What is claimed is:

1. A diagnostic tester system for use with a lighting system having at least one lamp, a ballast, a capacitor, and a plurality of wires interconnecting the lamp, the ballast, and the capacitor and an external power supply, the diagnostic tester system comprising:

a diagnostic receptacle electrically coupled to each of the lamp, the ballast, the capacitor, the plurality of wires, and to the external power supply;

a continuity plug adapted to be inserted into the diagnostic receptacle to permit operable connection of the lamp, the ballast, the capacitor, and the plurality of wires through the diagnostic receptacle to the external power supply, the continuity plug being configured to automatically disconnect the external power supply from the diagnostic receptacle when the continuity plug is removed from the diagnostic receptacle;

connector means for electrically engaging the diagnostic receptacle in place of the continuity plug when the continuity plug has been removed from the diagnostic receptacle and the external power supply is disconnected from the diagnostic receptacle;

a portable diagnostic tester electrically coupled to the connector means, the diagnostic tester having an internal power source for individually and simultaneously testing the operability of the ballast, the capacitor, and the plurality of wires in the lighting system when the connector means is engaged with the diagnostic receptacle and the external power supply is disconnected from the diagnostic receptacle, wherein the connector means includes electrical connections with the diagnostic receptacle maintaining continuity with the ballast, the capacitor, and the plurality of wires in the lighting system with respect to the internal power source in the diagnostic tester while keeping the external power supply disconnected from the diagnostic receptacle and the diagnostic tester; and means in the diagnostic tester for indicating whether the ballast, the capacitor, and the plurality of wires in the lighting system are functioning properly using power only from the internal power source connected to the diagnostic receptacle.

2. The apparatus of claim 1 wherein the means for individually testing comprises:

means electrically coupled to the connector for testing the operability of the ballast in the lighting system;

means electrically coupled to the connector for testing the operability of the capacitor in the lighting system; and means electrically coupled to the connector for testing the operability of the plurality of wires in the lighting system.

3. The apparatus of claim 1 wherein the means for testing at least one of the ballast, the capacitor, and the plurality of wires tests all of the ballast, the capacitor and the plurality of wires simultaneously.

4. The apparatus of claim 1 wherein the means for testing at least one of the ballast, the capacitor, and the plurality of wires tests the at least one of the ballast, the capacitor, and the plurality of wires automatically when the connector is engaged with the diagnostic receptacle.

5. The system of claim 1 wherein the indicating means includes illuminatible means capable of illumination; and the means for testing the capacitor includes multivibrator circuit means, connectable to the capacitor and the illuminatible means, for causing the illuminatible means to blink at a rate which is a function of capacitance of the capacitor, and for preventing the illuminatable means from blinking if the capacitor is either defective or improperly connected.

6. The system of claim 1 wherein the means for testing the ballast comprises switch means connecting the indicating means between a power source and ground for activating the indicating means when the switch means is in a conducting state, the switch means connected to the ballast and switched to a power conducting state when the ballast is properly functioning.

7. The system of claim 6 wherein the ballast includes a primary winding and a secondary winding, and the means for testing the ballast includes separate means for individually testing the primary winding and the secondary winding, and separate indicating means connected to each testing means for separately indicating proper functioning of ballast primary winding and the ballast secondary winding.

8. The system of claim 1 wherein the means for testing the plurality of wires comprises a wiring test circuit and a pair of illuminatible means connected to the wires for indicating whether the plurality of wires are connected properly.

9. A method of testing a lighting system having at least one lamp, a ballast, a capacitor, and a plurality of wires interconnecting the lamp, the ballast, and the capacitor and an external power supply, the method comprising the steps of:
    electrically connecting a diagnostic receptacle to the lamp, the ballast, the capacitor, the plurality of wires, and to the external power supply, the diagnostic receptacle comprising all electrical connection points needed to electrically connect a diagnostic tester to the lamp, the ballast, the capacitor, and the plurality of wires;
    providing a single continuity plug adapted for removable insertion into the diagnostic receptacle to connect the external power supply to the lighting system for normal operation thereof;
    disconnecting the external power supply from the lighting system;
    removing the continuity plug from the diagnostic receptacle after disconnecting the external power supply from the lighting system;
    connecting a single diagnostic tester to the diagnostic receptacle, the diagnostic tester being capable of testing all of the plurality of wires, the ballast and the capacitor, the diagnostic tester further comprising a single diagnostic connector adapted to mate with all of the electrical connection points in the diagnostic receptacle in a one step plug-in connection, and an internal power source;
    simultaneously testing the capacitor, the ballast and the plurality of wires contained in the lighting system using the internal power source in the diagnostic tester;
    indicating on the diagnostic tester whether the tested capacitor, ballast and plurality of wires are functioning properly;
    disconnecting the diagnostic tester from the diagnostic receptacle;
    replacing the continuity plug in the diagnostic receptacle after disconnecting the diagnostic tester from the diagnostic receptacle; and
    restoring the external power supply to the lighting system.

10. The system of claim 1 wherein the indicating means comprises a plurality of light emitting diodes;
    the diagnostic tester further comprising:
    test means for connecting all of light emitting diodes to an electrical power source to check for operable illumination of the light emitting diodes.

11. The system of claim 1 further comprising:
    a portable housing;
    the connector means coupled to the housing;
    the means for testing at least one of the ballast, the capacitor, and the plurality of wires, and the indicating means all carried by the housing.

12. The system of claim 11 further comprising:
    a pair of terminals mounted on and extending outward from the housing, the terminals spaced apart a distance adapted for engagement with opposed conductive ends of a fuse; and
    the means for testing including means for connecting the terminals across an indicating means in the housing to indicate the continuity of the fuse by the illumination state of the indicating means.

13. A diagnostic tester system for use with a lighting system having at least one lamp, a ballast, a capacitor, and a plurality of wires interconnecting the lamp, the ballast, and the capacitor, the lighting system including a diagnostic receptacle electrically coupled to the lamp, the ballast, the capacitor, the plurality of wires and to an external power supply, the diagnostic tester system comprising:
    a continuity plug adapted to be inserted into the diagnostic receptacle to permit operable connection of the lamp, the ballast, the capacitor, and the plurality of wires through the diagnostic receptacle to the external power supply;
    a portable diagnostic tester electrically coupled to the connector means for individually and simultaneously testing the operability of the ballast, the capacitor, and the plurality of wires in the lighting system with an internal power source in the diagnostic tester when the connector means is engaged with the diagnostic receptacle and the external power supply is disconnected from the diagnostic receptacle; and
    means in the diagnostic tester for indicating whether the ballast, the capacitor, and the plurality of wires in the lighting system are functioning properly when the external power supply is disconnected from the diagnostic receptacle.

14. The diagnostic tester system of claim 13 wherein the testing means comprises:
    a multivibrator circuit means electrically coupled to the connector and means electrically connected to the capacitor through the connector means for testing the capacitor, the multivibrator circuit including a light emitting diode visible externally of the housing, the multivibrator circuit alternatingly changing the state of the light emitting diode based on the amount of capacitance of the capacitor;
    a ballast test circuit electrically coupled to the connector means and connectable to the ballast through the connector means for testing the ballast, the ballast test circuit including a light emitting diode visible externally of the housing for indicating current flow in the ballast; and
    a wiring test circuit electrically coupled to the connector means and connectable to the plurality of wires through the connector means for testing the plurality of wires in the lighting system, the wiring test circuit including a pair of light emitting diodes visible externally of the housing for indicating proper current flow through the plurality of wires.

15. The method of claim 9 further comprising the steps of:
    providing illuminatible devices on the diagnostic tester for indicating proper function of the capacitor, the ballast and the plurality of wires; and before connecting the diagnostic tester to the diagnostic receptacle, applying electrical power to the illuminatible devices to indicate proper operation of the illuminatible devices by illumination thereof.

16. The method of claim 9 further comprising the steps of:

providing a pair of spaced terminals on the tester;

connecting the terminals across an indicator in the tester; and applying electrical power to the indicator and the terminals while engaging the terminals with a fuse to indicate the continuity of the fuse by the illumination state of the indicator.

17. The method of claim 9 wherein the step of testing the ballast contained in the lighting system includes testing both a ballast primary winding and a ballast secondary winding.

18. The method of claim 9 wherein the steps of testing the capacitor, testing the ballast, and testing the plurality of wires are performed simultaneously when the diagnostic tester is connected to the diagnostic receptacle.

19. The method of claim 9 wherein the steps of testing the capacitor, testing the ballast, and testing the plurality of wires are performed automatically when the diagnostic tester is connected to the diagnostic receptacle.

20. The method of claim 9 wherein the step of testing comprises the steps of:

testing the capacitor contained in the lighting system using the diagnostic tester;

indicating on the diagnostic tester whether the capacitor is functioning properly;

testing the ballast contained in the lighting system using the diagnostic tester;

indicating on the diagnostic tester whether the ballast is functioning properly;

testing the plurality of wires contained in the lighting system using the diagnostic tester; and indicating on the diagnostic tester whether the plurality of wires are functioning properly.

* * * * *

UNITED STATES PATENT AND TRADEMARK OFFICE
CERTIFICATE OF CORRECTION

PATENT NO. : 6,087,834
DATED : July 11, 2000
INVENTOR(S) : Tury & Spink

Page 1 of 1

It is certified that error appears in the above-identified patent and that said Letters Patent is hereby corrected as shown below:

Claim 2,
Line 1, delete "apparatus" and insert -- system --.

Claim 3,
Line 1, delete "apparatus" and insert -- system --.

Claim 4,
Line 1, delete "apparatus" and insert -- system --.

Column 2,
Line 9, delete the hyphen between "the" and "capacitor"

Column 6,
Line 49, delete "108a" and insert -- 108g --

Signed and Sealed this

Twenty-first Day of August, 2001

Attest:

*Nicholas P. Godici*

NICHOLAS P. GODICI
*Attesting Officer*   *Acting Director of the United States Patent and Trademark Office*